(12) United States Patent
Lin

(10) Patent No.: US 9,076,834 B2
(45) Date of Patent: Jul. 7, 2015

(54) SPACER FOR THERMAL PLATE IN SEMICONDUCTOR PROCESSING

(71) Applicant: UNITED MICROELECTRONICS CORP., Hsin-Chu (TW)

(72) Inventor: Yong-An Lin, Singapore (SG)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 246 days.

(21) Appl. No.: 13/629,634

(22) Filed: Sep. 28, 2012

(65) Prior Publication Data

US 2014/0091512 A1  Apr. 3, 2014

(51) Int. Cl.
| | |
|---|---|
| B23Q 3/00 | (2006.01) |
| H01L 21/687 | (2006.01) |
| B27B 17/00 | (2006.01) |
| B25H 1/00 | (2006.01) |

(52) U.S. Cl.
CPC ......... *H01L 21/6875* (2013.01); *B27B 17/0041* (2013.01); *B25H 1/00* (2013.01); *B25H 1/0007* (2013.01)

(58) Field of Classification Search
USPC ....................................................... 269/296
See application file for complete search history.

(56) References Cited

U.S. PATENT DOCUMENTS

| | | | | |
|---|---|---|---|---|
| 5,885,353 | A * | 3/1999 | Strodtbeck et al. | 118/712 |
| 6,285,078 | B1 * | 9/2001 | Nelson | 257/712 |
| 6,709,218 | B1 * | 3/2004 | Freerks et al. | 414/217 |
| 6,805,338 | B1 * | 10/2004 | Okuda | 269/21 |
| 7,584,947 | B2 * | 9/2009 | Freeland | 269/296 |
| 7,745,762 | B2 * | 6/2010 | Timans | 219/390 |
| 8,003,919 | B2 * | 8/2011 | Goto et al. | 219/390 |
| 2004/0159997 | A1 * | 8/2004 | Han et al. | 269/296 |
| 2005/0035312 | A1 * | 2/2005 | Foth | 250/559.29 |
| 2006/0090855 | A1 * | 5/2006 | Kimura | 156/345.52 |
| 2006/0289432 | A1 * | 12/2006 | Morita et al. | 219/390 |
| 2006/0289433 | A1 * | 12/2006 | Timans | 219/390 |
| 2007/0128570 | A1 * | 6/2007 | Goto et al. | 432/253 |
| 2007/0221253 | A1 * | 9/2007 | Nishikido | 134/26 |
| 2007/0269302 | A1 * | 11/2007 | Kim et al. | 414/744.1 |
| 2008/0074657 | A1 * | 3/2008 | Kondo et al. | 356/237.4 |
| 2008/0171131 | A1 * | 7/2008 | Moro et al. | 427/8 |
| 2009/0051370 | A1 * | 2/2009 | Doki et al. | 324/658 |
| 2010/0252547 | A1 * | 10/2010 | Timans | 219/390 |
| 2010/0295229 | A1 * | 11/2010 | Halford | 269/296 |
| 2014/0057052 | A1 * | 2/2014 | Cheng et al. | 427/289 |

\* cited by examiner

*Primary Examiner* — Lee D Wilson
*Assistant Examiner* — Alvin Grant
(74) *Attorney, Agent, or Firm* — Winston Hsu; Scott Margo

(57) ABSTRACT

A spacer for a thermal plate in semiconductor processing includes a base substrate having a top surface defined thereon, a wafer having a bottom surface covering a portion of the base substrate, and a plurality of air passages formed in between the bottom surface of the wafer and the base substrate. The air passages connect the bottom surface of the wafer to an ambience.

18 Claims, 10 Drawing Sheets

SPACER FOR THERMAL PLATE IN SEMICONDUCTOR PROCESSING

BACKGROUND OF THE INVENTION

1. Field of the Invention

The invention relates to a spacer for a thermal plate in semiconductor process, and more particularly, to a spacer for a thermal plate in a cooling system in semiconductor process.

2. Description of the Prior Art

In the semiconductor processing, the application of the thermal treatment step is very common. A thermal processing recipe typically includes a step of heating a product wafer to a specified temperature for a specified time period for achieving specified result. The heated product wafer is then discharged to a cooling system to reduce the wafer temperature before next process.

The cooling systems conventionally including a cooling arm supplies ambient water as a process cooling medium, and the cooling arm essentially includes a spacer for positioning the product wafer to be cooled down. However, it is found that strong vacuum is often generated in between the product wafer and the spacer during cooling down. Therefore the product wafer is held tightly or stuck up to the spacer, and thus the product wafer suffers scraping, cracking, or even being broken due to different heat expansion coefficients between the product wafer and the spacer.

Therefore, a solution for preventing the wafer to be cooled from being scraped, cracked, or even broken during cooling down is always in need.

SUMMARY OF THE INVENTION

According to the claimed invention, a spacer for a thermal plate in semiconductor processing is provided. The spacer includes a base substrate having a top surface defined thereon, a wafer having a bottom surface covering a portion of the top surface of the base substrate, and a plurality of air passages formed in between the bottom surface of the wafer and the base substrate. The air passages connect the bottom surface of the wafer to an ambience.

According to the spacer for the thermal plate in semiconductor processing provided by the present invention, the air passages formed in between the bottom surface of the wafer and the base substrate of the spacer connect the wafer to the ambience, so that the vacuum condition is prevented from being generated. Consequently, wafer is no longer tightly stuck up to the spacer, and thus the wafer scraping, wafer cracking and even the breakage during wafer cooling down are all avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
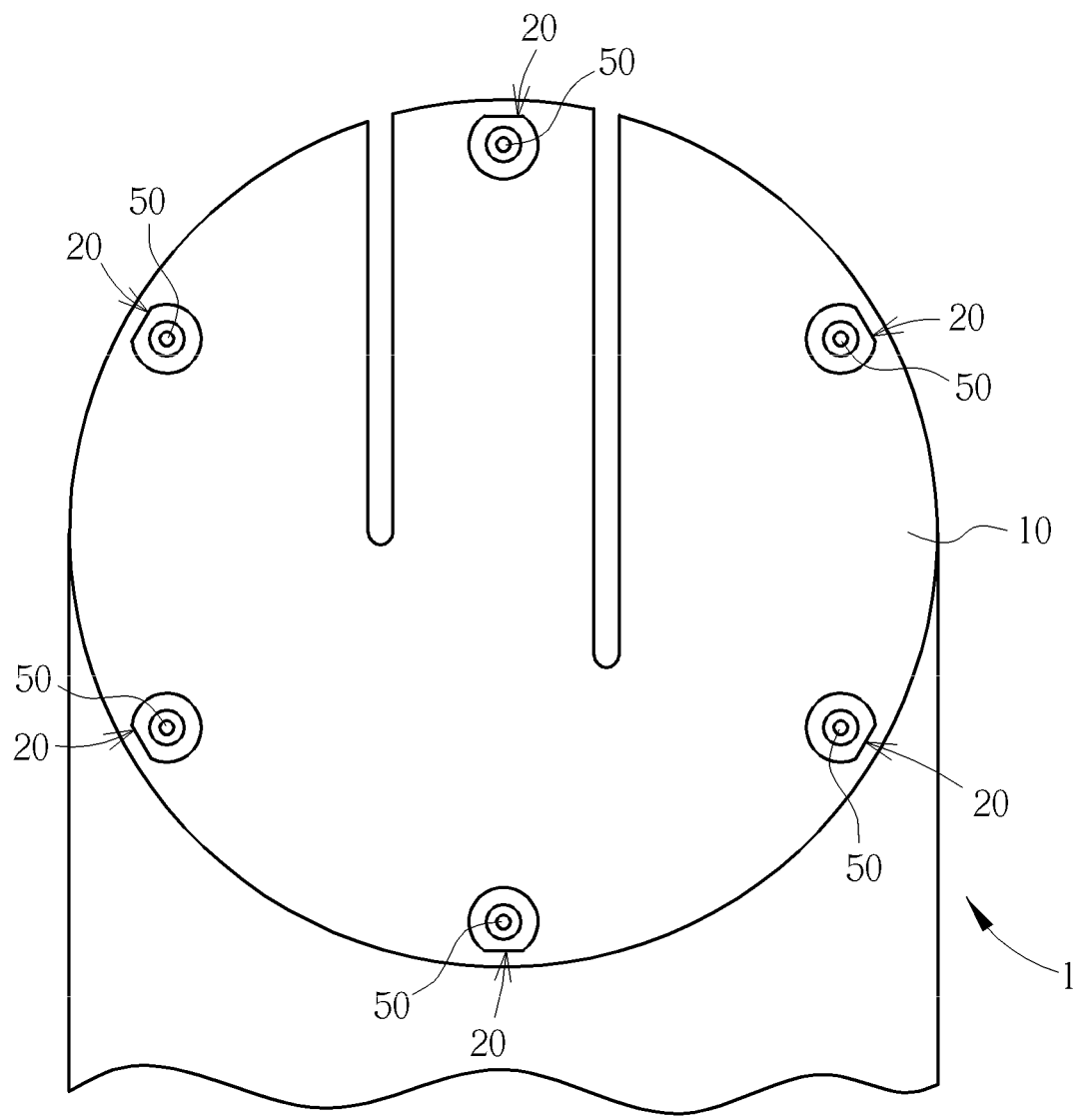
FIG. 1 is a schematic drawing illustrating a cooling arm having spacers provided by the present invention.
Figure 2:
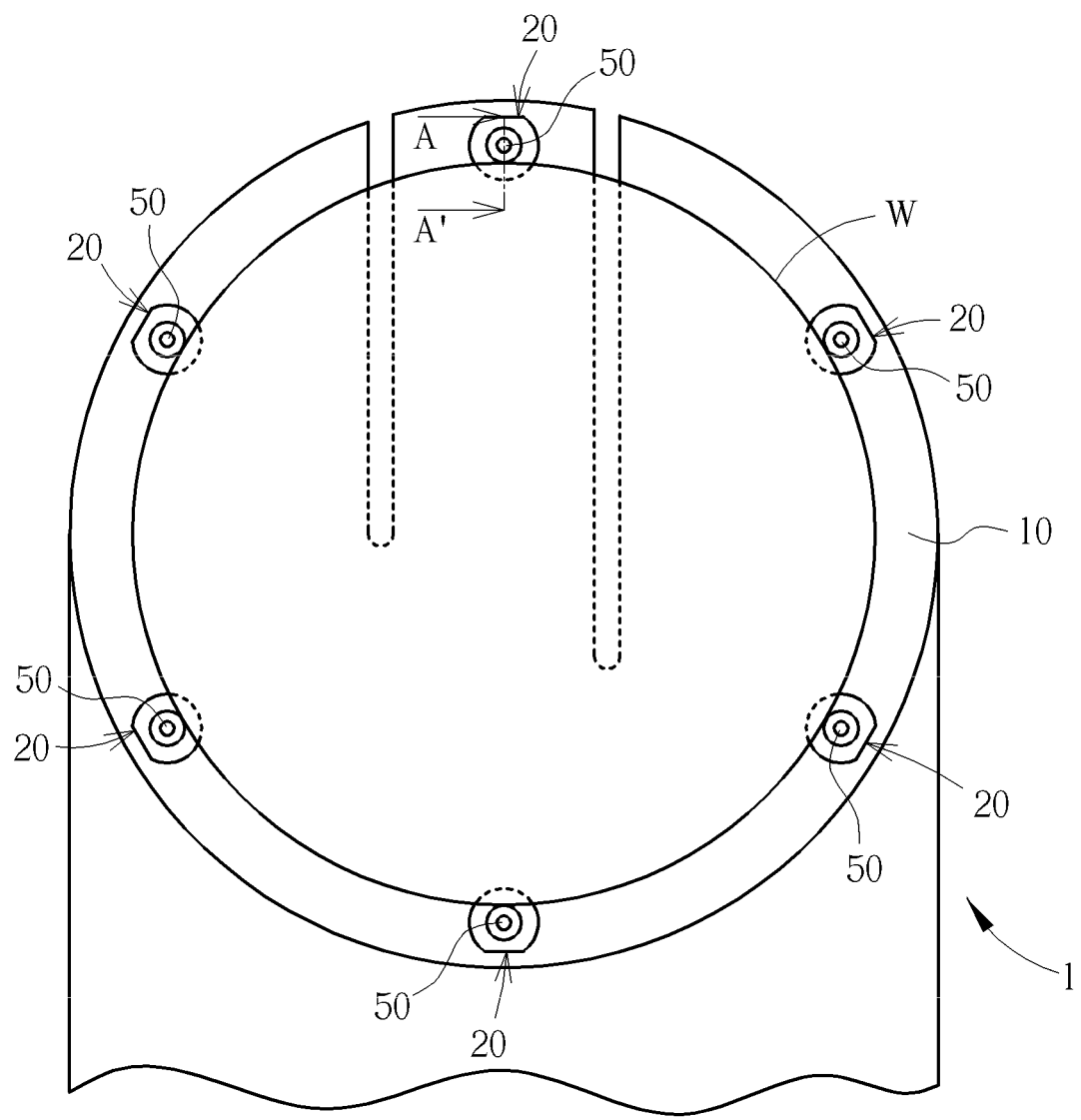
FIG. 2 is a schematic drawing illustrating the cooling arm having a wafer positioned thereon.

Please refer to FIGS. 1-2, wherein FIG. 1 is a schematic drawing illustrating a cooling arm having spacers provided by the present invention and FIG. 2 is a schematic drawing illustrating the cooling arm having a wafer to be cooled down positioned thereon. As shown in FIG. 1, a cooling arm 1 is provided by the present invention, the cooling arm 1 is a plate and includes a wafer supporting unit 10 formed in a substantially circular shape. In some applications, the cooling arm 1 serves both as a cooling mechanism of a wafer and a transfer mechanism of the wafer. The cooling arm 1 includes a plurality of spacers 20 formed at the edge of the wafer supporting unit 10. It is noteworthy that the cooling arm 1 is provided as an example, the spacers 20 provided by the present invention can be applied to any thermal plate for cooling apparatus or heating apparatus. Additionally, the number of the spacers can be adjusted to fit the needs.

As shown in FIGS. 1-2, each of the spacers 20 includes a wafer guide 50 formed in a center thereof. The wafer guides 50 fix the spacers 20 to the cooling arm 1 as shown in FIG. 1. More important, the wafer guides 50 guide a wafer W to be cooled down to a center of the wafer supporting unit 10, and prevent the wafer W from side slipping from the cooling arm 1.

Figure 3:
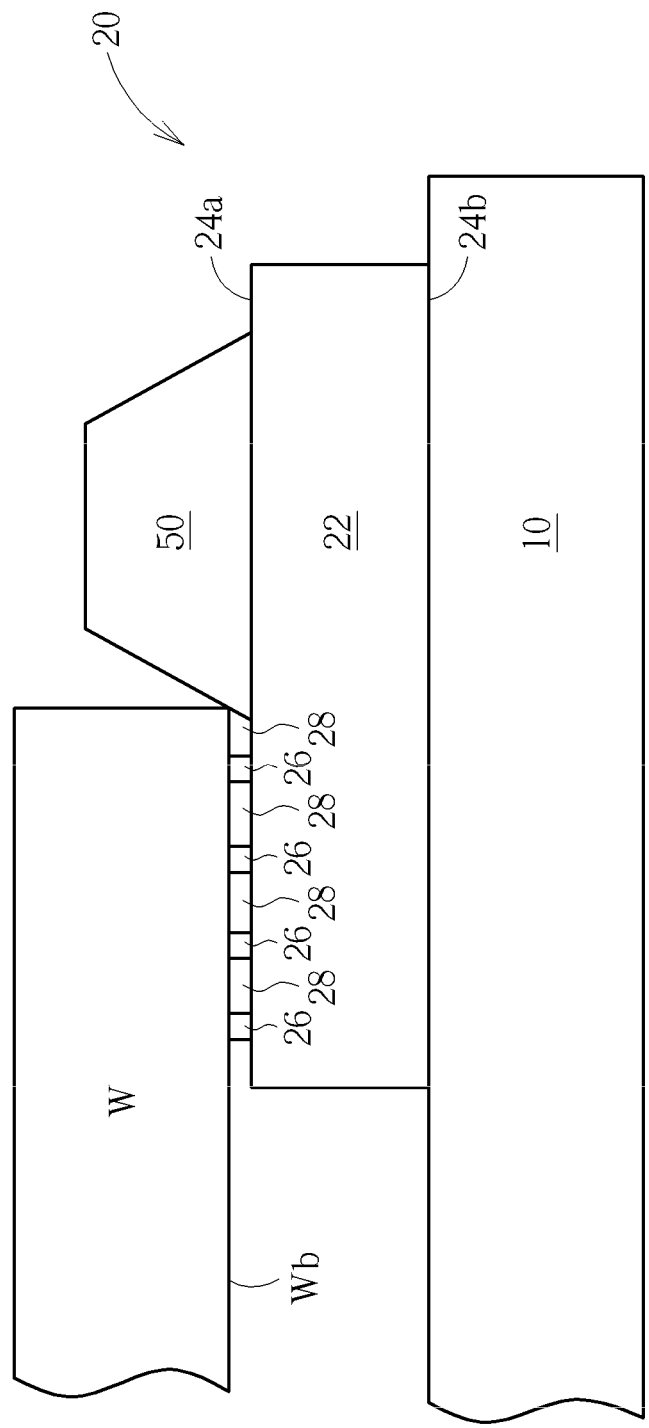
FIG. 3 is a cross-sectional view of the spacer provided by a first preferred embodiment of the present invention taken along a line A-A' of FIG. 2.

Please refer to FIG. 3, which is a cross-sectional view of the spacer provided by a first preferred embodiment of the present invention taken along a line A-A' of FIG. 2. As shown in FIG. 3. The spacer 20 includes a base substrate 22, and the base substrate 22 includes ceramic, but not limited to this. The base substrate 22 of the spacer 20 includes a top surface 24a and a bottom surface 24b as shown in FIG. 3. More important, the spacer 20 includes a plurality of protrusions 26 extending upwardly from the top surface 24a of the base substrate 22. As mentioned above, the wafer W to be cooled down is positioned on the spacer 20 and guided to a center portion of the wafer supporting unit 10, and thus the wafer W covers a portion of the top surface 24a of the base substrate 22. In accordance with the preferred embodiment, a bottom surface $W_b$ of the wafer W contacts top surfaces of the protrusions 26 as shown in FIG. 3. Therefore a plurality of air passages 28 is formed in between the bottom surface $W_b$ of the wafer W and the base substrate 22. Specifically speaking, the air passages 28 are formed between the bottom surface $W_b$ of the wafer W, the protrusions 26, and the top surface 24a of the base substrate 22. The air passages 28 connect the bottom surface $W_b$ of the wafer W to an ambience as shown in FIG. 3.

Figure 4:
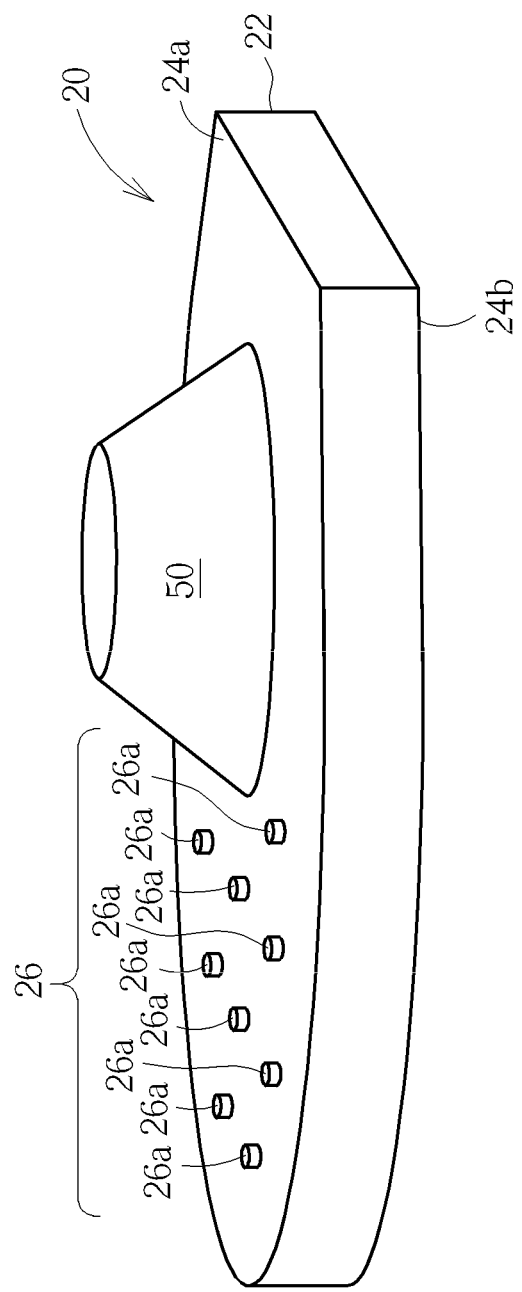
FIGS. 4-6 are schematic drawings illustrating variants of the first preferred embodiment.
Figure 5:
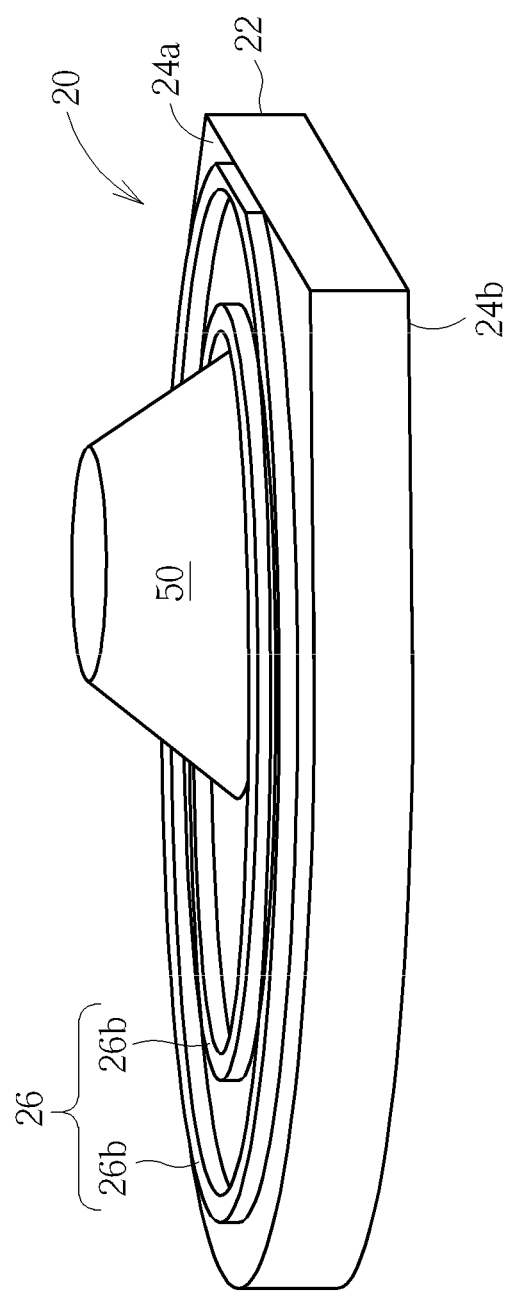
Figure 6:
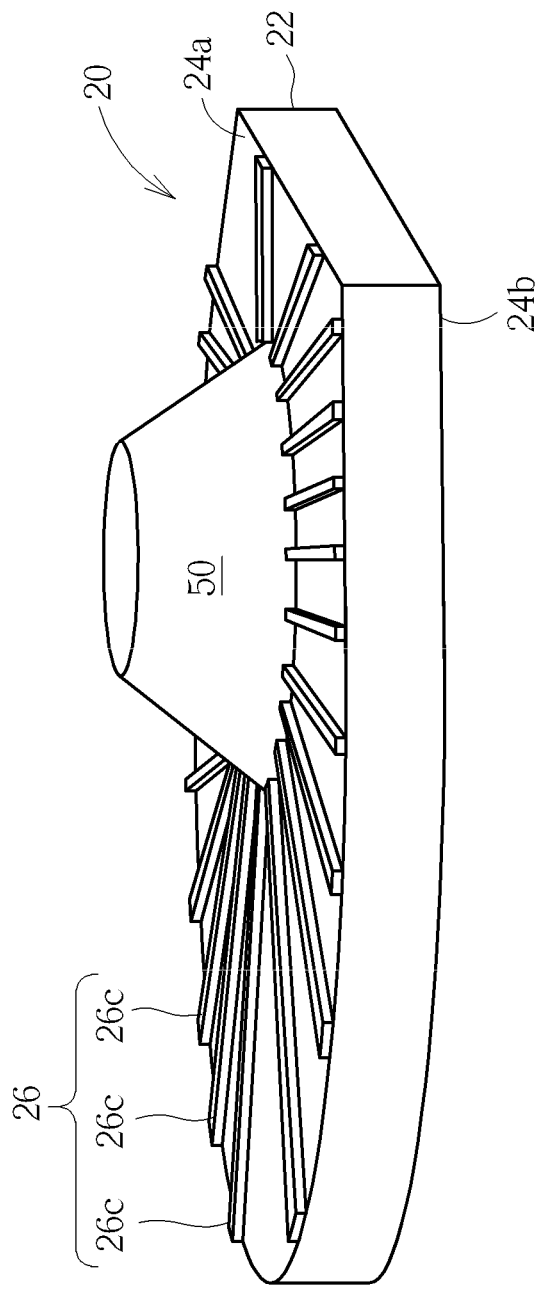

Please refer to FIGS. 4-6, which are schematic drawings illustrating variants of the first preferred embodiment. According to a first variant of the first preferred embodiment, the protrusions 26 includes a plurality of nipples 26a randomly formed on the top surface 24a of the base substrate 22 as shown in FIG. 4. According to a second variant of the first preferred embodiment, the protrusions 26 include a concentric circle pattern 26b formed on the top surface 24a of the base substrate 22 as shown in FIG. 5. According to a third variant of the first preferred embodiment, the protrusions 26 includes an omni-directional radiation pattern 26c formed on the top surface 24a of the base substrate 22 as shown in FIG. 6.

Please refer to FIGS. 3-6 again. According to the spacer 20 provided by the first preferred embodiment of the present invention, the air passages 28 formed between the bottom surface $W_b$ of the wafer W, the protrusions 26 (includes nipples 26a, the concentric circle pattern 26b, and the omni-directional radiation pattern 26c), and the top surface 24a of the base substrate 22 connect the bottom surface $W_b$ of the wafer W to the ambience. Therefore, no vacuum condition will be generated between the wafer W and spacer 20 during cooling down. Consequently, the wafer W is always prevented from being stuck to the spacer 20 and further prevented from scrape, crack, or even breakage due to the different heat expansion coefficients between the wafer W and the base substrate 22 during cooling down.

Figure 7:
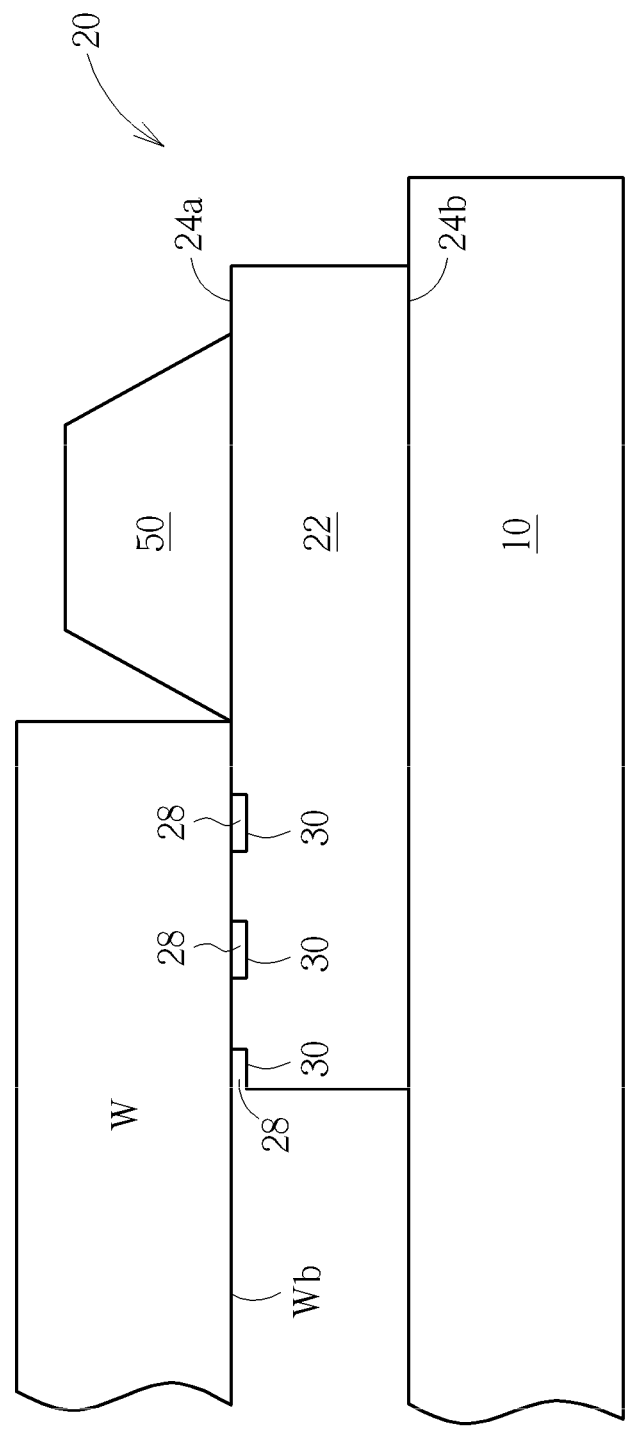
FIG. 7 is a cross-sectional view of the spacer provided by a second preferred embodiment of the present invention also taken along the line A-A' of FIG. 2.

Please refer to FIG. 7, which is a cross-sectional view of the spacer provided by a second preferred embodiment of the present invention also taken along the line A-A' of FIG. 2. Please note that the elements the same in both of the first and second preferred embodiments are designated to the same numerals. As shown in FIG. 7. The spacer 20 includes a base substrate 22, and the base substrate 22 includes ceramic, but not limited to this. The base substrate 22 of the spacer 20 includes a top surface 24a and a bottom surface 24b as shown in FIG. 7. More important, the spacer 20 includes a plurality of notches 30 extending downwardly from the top surface 24a of the base substrate 22. As mentioned above, the wafer W to be cooled down is positioned on the spacer 20 and guided to a center portion of the wafer supporting unit 10, and thus the wafer W covers a portion of the top surface 24a of the base substrate 22. Furthermore, a bottom surface $W_b$ of the wafer W contacts the top surface 24a of the base substrate 22 as shown in FIG. 7. Therefore a plurality of air passages 28 is formed in between the bottom surface $W_b$ of the wafer W and the base substrate 22. Specifically speaking, the passages 28 are formed in between the bottom surface $W_b$ of the wafer W and the notches 30. The air passages 28 connect the bottom surface $W_b$ of the wafer W to an ambience as shown in FIG. 7.

Figure 8:
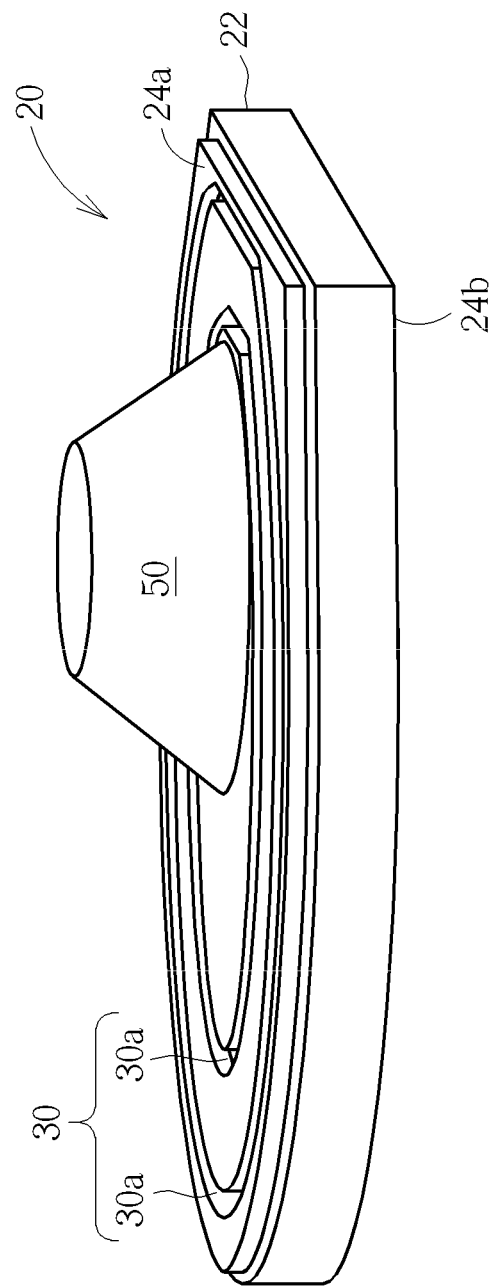
FIGS. 8-9 are schematic drawings illustrating variants of the second preferred embodiment.
Figure 9:
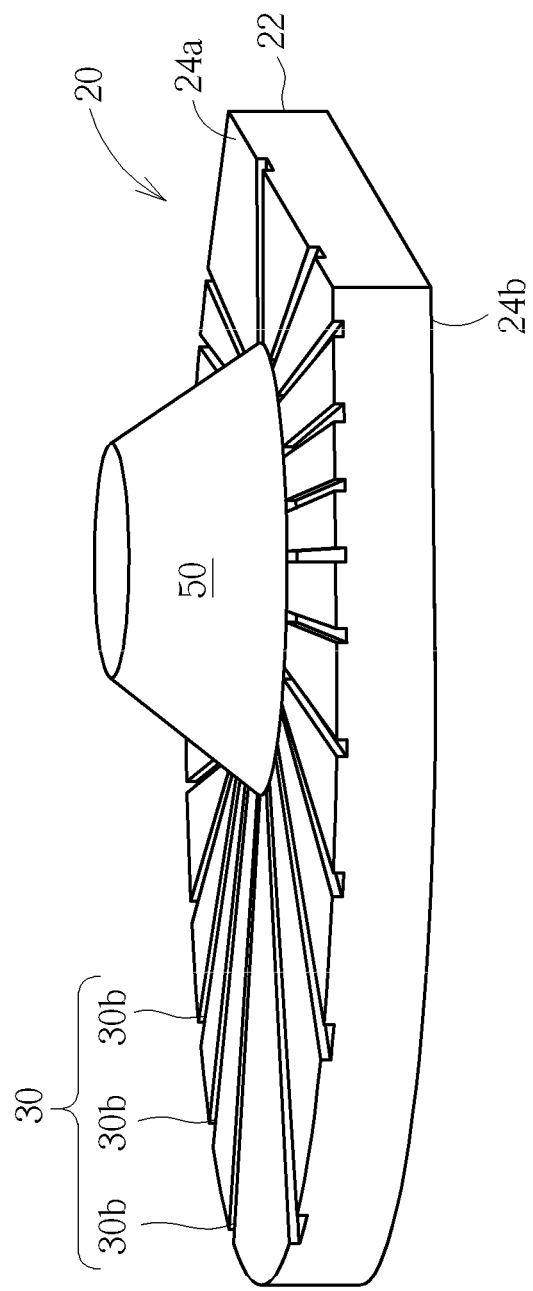

Please refer to FIGS. 8-9, which are schematic drawings illustrating variants of the second preferred embodiment. According to a first variant of the second preferred embodiment, the notches 30 include a concentric circle pattern 30a formed on the top surface 24a of the base substrate 22 as shown in FIG. 8. According to a second variant of the second preferred embodiment, the notches 30 include an omni-directional radiation pattern 30b formed on the top surface 24a of the base substrate 22 as shown in FIG. 9.

Please refer to FIGS. 7-9 again. According to the spacer 20 provided by the second preferred embodiment of the present invention, the air passages 28 formed between the bottom surface $W_b$ of the wafer W and the notches 30 (includes the concentric circle pattern 30a and the omni-directional radiation pattern 30b) connect the bottom surface $W_b$ of the wafer W to the ambience. Therefore, no vacuum condition is generated between the wafer W and spacer 20 during cooling down. Consequently, the wafer W is always prevented from being stuck to the spacer 20 and further prevented from scrape, crack, or even breakage due to the different heat expansion coefficients between the wafer W and the base substrate 22 during cooling down.

Figure 10:
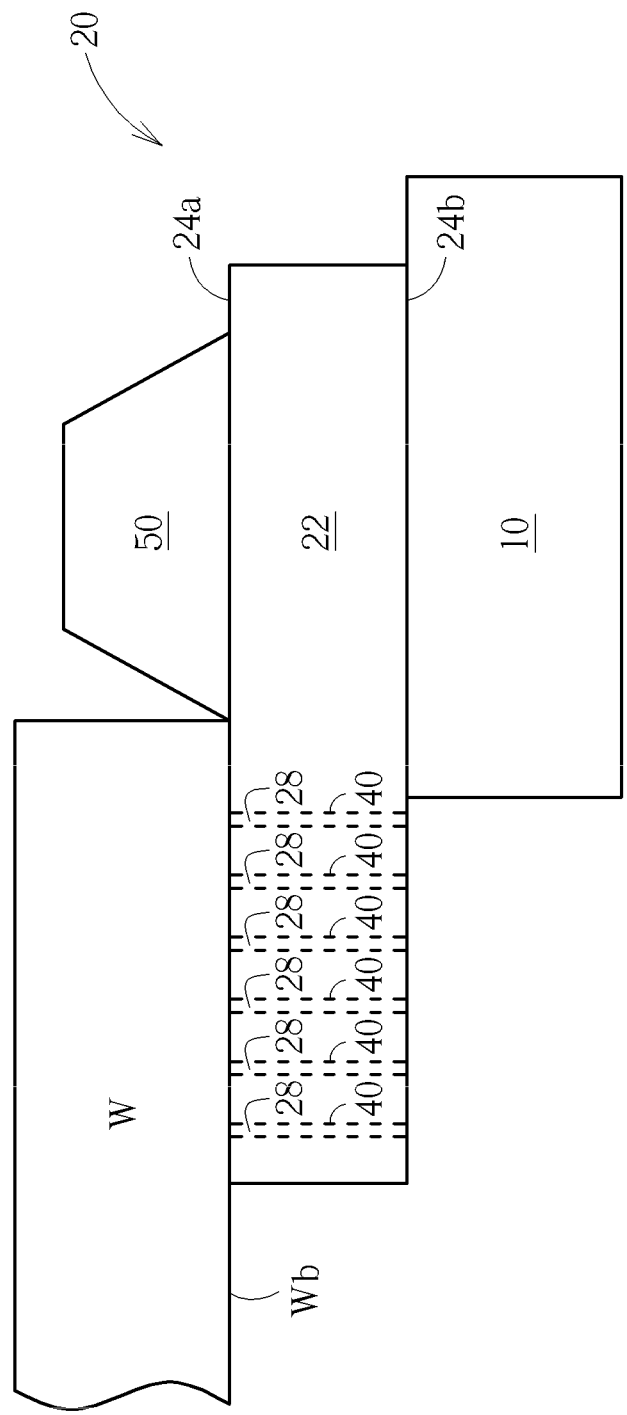
FIG. 10 is a cross-sectional view of the spacer provided by a third preferred embodiment of the present invention.

Please refer to FIG. 10, which is a cross-sectional view of the spacer provided by a third preferred embodiment of the present invention. Please note that the elements the same in the first, second, and third preferred embodiments are all designated to the same numerals. It should also be noted that the wafer supporting unit 10 includes not only the circular shape as mentioned above, but also other shape such as a ring shape as depicted in FIG. 10. As shown in FIG. 10. The spacer 20 includes a base substrate 22, and the base substrate 22 includes ceramic, but not limited to this. The base substrate 22 of the spacer 20 includes a top surface 24a and a bottom surface 24b as shown in FIG. 3. More important, the spacer 20 includes a plurality of pin holes 40 penetrating the base substrate 22 itself. Specifically speaking, the pin holes 40 penetrate the base substrate 22 from the top surface 24a of the base substrate 22 to the bottom surface 24b of the base substrate 22. As mentioned above, the wafer W to be cooled down is positioned on the spacer 20 and guided to a center portion of the wafer supporting unit 10, and thus the wafer W covers a portion of the top surface 24a of the base substrate 22. Furthermore, a bottom surface $W_b$ of the wafer W contacts the top surface 24a of the base substrate 22 as shown in FIG. 10. Therefore a plurality of air passages 28 is formed in between the bottom surface $W_b$ of the wafer W and the pin holes 40. The air passages 28 connect the bottom surface $W_b$ of the wafer W to an ambience as shown in FIG. 10.

According to the spacer 20 provided by the third preferred embodiment of the present invention, the air passages 28 formed between the bottom surface $W_b$ of the wafer W and the pin holes 40 connect the bottom surface $W_b$ of the wafer W to the ambience. Therefore, no vacuum condition is generated between the wafer W and spacer 20 during cooling down. Consequently, the wafer W is always prevented from being stuck to the spacer 20 and further prevented from scrape, crack, or even breakage due to the different heat expansion coefficients between the wafer W and the base substrate 22 during cooling down. Furthermore, it is well-known that the base substrate 22, which includes ceramic, is always consumed because the wafer W rubs against the base substrate 22 of the spacer 20. However, since the pin holes 40 penetrates the base substrate 22 from its top surface 24a to its bottom surface 24b, it always exist within the base substrate 22 even the base substrate 22 is severely consumed. In other words, the lifetime of the spacer 20 is extraordinarily prolonged and thus the machinery cost is reduced.

According to the spacer for the thermal plate in semiconductor processing provided by the present invention, the air passages formed in between the bottom surface of the wafer and the base substrate of the spacer connect the wafer to the ambience, such that the vacuum condition is prevented from being generated. Consequently, wafer is no longer tightly stuck up on the spacer and the wafer scraping, wafer cracking and even the breakage during cooling down are all avoided. In addition, it is conceivable that the vacuum condition may occur between the wafer and the spacers of plate in cooling apparatus or heating apparatus because it always involves temperature change, therefore it is more preferable to adopt the spacers provided by the present invention in thermal plate for cooling apparatus or heating apparatus.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A spacer positioned on a cooling arm of a thermal plate in semiconductor processing comprising:
   a base substrate having a top surface defined thereon;
   a wafer having a bottom surface covering a portion of the top surface of the base substrate; and a plurality of air passages formed in between the bottom surface of the wafer and the base substrate, the air passages connecting the bottom surface of the wafer to an ambience, wherein the spacer is fixed to the cooling arm.

2. The spacer positioned on the cooling arm of the thermal plate in semiconductor processing according to claim 1, further comprising a plurality of protrusions extending upwardly from the top surface of the base substrate.

3. The spacer positioned on the cooling arm of the thermal plate in semiconductor processing according to claim 2, wherein the bottom surface of the wafer contacts top surfaces of the protrusions.

4. The spacer positioned on the cooling arm of the thermal plate in semiconductor processing according to claim 3, wherein the air passages are formed between the bottom surface of the wafer, the protrusions, and the top surface of the base substrate.

5. The spacer positioned on the cooling arm of the thermal plate in semiconductor processing according to claim 3, wherein the protrusions comprise a plurality of nipples randomly formed on the top surface of the base substrate.

6. The spacer positioned on the cooling arm of the thermal plate in semiconductor processing according to claim 3, wherein the protrusions comprise a concentric circle pattern formed on the top surface of the base substrate.

7. The spacer positioned on the cooling arm of the thermal plate in semiconductor processing according to claim 3, wherein the protrusions comprise an omni-directional radiation pattern formed on the top surface of the base substrate.

8. The spacer positioned on the cooling arm of the thermal plate in semiconductor processing according to claim 1, further comprising a plurality of notches extending downwardly from the top surface of the base substrate.

9. The spacer positioned on the cooling arm of the thermal plate in semiconductor processing according to claim 8, wherein the bottom surface of the wafer contacts the top surface of the base substrate.

10. The spacer positioned on the cooling arm of the thermal plate in semiconductor processing according to claim 9, wherein the air passages are formed between the bottom surface of the wafer and the notches.

11. The spacer positioned on the cooling arm of the thermal plate in semiconductor processing according to claim 8, wherein the notches comprise a concentric circle pattern formed on the top surface of the base substrate.

12. The spacer positioned on the cooling arm of the thermal plate in semiconductor processing according to claim 8 wherein the notches comprise an omni-directional radiation pattern formed on the top surface of the base substrate.

13. The spacer positioned on the cooling arm of the thermal plate in semiconductor processing according to claim 1, further comprising a plurality of pin holes penetrating the base substrate from the top surface of the base substrate to a bottom surface of the base substrate.

14. The spacer positioned on the cooling arm of the thermal plate in semiconductor processing according to claim 13, wherein the air passages are formed between the bottom surface of the wafer and the pin holes.

15. The spacer positioned on the cooling arm of the thermal plate in semiconductor processing according to claim 1, wherein the base substrate comprises ceramic.

16. The spacer positioned on the cooling arm of the thermal plate in semiconductor processing according to claim 1, further comprising a wafer guide formed in a center thereof.

17. The spacer positioned on the cooling arm of the thermal plate in semiconductor processing according to claim 16, wherein the wafer guide fixes the spacer to the cooling arm and guides the wafer to a center of the cooling arm.

18. A cooling arm for a cooling and transferring a wafer in semiconductor processing comprising:

a wafer supporting unit;

a wafer positioned on the wafer supporting unit, the wafer comprising a bottom surface; and a plurality of spacers formed at an edge of the wafer supporting unit, and each of the spacers comprising:

a base substrate positioned on the wafer supporting unit; and a plurality of air passages formed in between the bottom surface of the wafer and the base substrate, the air passages connecting the bottom surface of the wafer to an ambience, wherein the spacers are fixed to the cooling arm.

* * * * *